(12) United States Patent
Yau et al.

(10) Patent No.: US 11,289,445 B2
(45) Date of Patent: Mar. 29, 2022

(54) DIE BONDER INCORPORATING ROTATABLE ADHESIVE DISPENSER HEAD

(71) Applicant: ASM Technology Singapore Pte Ltd, Singapore (SG)

(72) Inventors: Wan Yin Yau, Hong Kong (HK); See Lok Chan, Hong Kong (HK); Chi Wah Cheng, Hong Kong (HK)

(73) Assignee: ASM TECHNOLOGY SINGAPORE PTE LTD, Singapore (SG)

( * ) Notice: Subject to any disclaimer, the term of this patent is extended or adjusted under 35 U.S.C. 154(b) by 490 days.

(21) Appl. No.: 16/231,637

(22) Filed: Dec. 24, 2018

(65) Prior Publication Data

US 2020/0203305 A1     Jun. 25, 2020

(51) Int. Cl.
| | |
|---|---|
| B05C 5/02 | (2006.01) |
| H01L 23/00 | (2006.01) |
| B05C 5/00 | (2006.01) |
| B05C 1/00 | (2006.01) |
| B05C 1/16 | (2006.01) |

(52) U.S. Cl.
CPC ................ *H01L 24/75* (2013.01); *B05C 1/00* (2013.01); *B05C 1/16* (2013.01); *B05C 5/002* (2013.01); *B05C 5/0208* (2013.01); *B05C 5/0212* (2013.01); *H01L 24/27* (2013.01); *H01L 2224/27312* (2013.01); *H01L 2224/75823* (2013.01)

(58) Field of Classification Search
None
See application file for complete search history.

(56) References Cited

U.S. PATENT DOCUMENTS

| | | |
|---|---|---|
| 5,141,165 A | 8/1992 | Sharpless |
| 6,447,847 B1 | 9/2002 | Hynes |
| 8,328,928 B2 | 12/2012 | Maeda |

(Continued)

FOREIGN PATENT DOCUMENTS

| | | |
|---|---|---|
| TW | 201009029 A1 | 3/2010 |
| TW | 2015 13762 A | 4/2015 |
| TW | M 561572 U | 6/2018 |

OTHER PUBLICATIONS

European Search Report, dated Jul. 7, 2020, issued in corresponding European Patent Application No. 19215175.1. Total 11 pages.

(Continued)

*Primary Examiner* — Charles Capozzi
(74) *Attorney, Agent, or Firm* — Ostrolenk Faber LLP

(57) ABSTRACT

An adhesive dispenser for a die bonding apparatus has an adhesive dispenser head configured to dispense adhesive onto bonding pads of a substrate, and a head conveyer configured to convey the adhesive dispenser head along orthogonal first and second axes for dispensing the adhesive onto target dispensing positions on the bonding pads. The head conveyor includes a first linear positioning motor operative to convey the adhesive dispenser head along the first axis and a rotary positioning motor coupled to the first linear positioning motor which is operative to rotate the adhesive dispenser head. The rotary positioning motor is configured to cooperate with the first linear positioning motor to convey the adhesive dispenser head along the second axis to the target dispensing positions.

16 Claims, 3 Drawing Sheets

(56) References Cited

U.S. PATENT DOCUMENTS

| | | |
|---|---|---|
| 9,936,585 B2 | 4/2018 | Reid |
| 2002/0014519 A1* | 2/2002 | Ozono ................ B23K 3/0607 228/248.1 |
| 2002/0048633 A1* | 4/2002 | Rutledge ............... B05C 5/0216 427/231 |
| 2002/0143416 A1* | 10/2002 | Seshan ............... H05K 13/0469 700/95 |
| 2005/0095367 A1 | 5/2005 | Babiarz |
| 2006/0103788 A1 | 5/2006 | Kurosawa |
| 2010/0093131 A1 | 4/2010 | Maeda |
| 2012/0097097 A1* | 4/2012 | Ikushima ............. B05B 9/0409 118/300 |
| 2016/0158786 A1* | 6/2016 | Christensen ......... H05K 3/0091 118/323 |

OTHER PUBLICATIONS

Taiwanese Office Action, dated May 18, 2020, issued in corresponding Taiwanese Patent Application No. 108145314. English Search Report. Total 8 pages.

* cited by examiner

DIE BONDER INCORPORATING ROTATABLE ADHESIVE DISPENSER HEAD

FIELD OF THE INVENTION

The invention relates to an adhesive dispenser for a die bonding apparatus and in particular to an adhesive dispenser having a rotatable adhesive dispenser head.

BACKGROUND

During the production of semiconductor dice or chips, many semiconductor dice are formed together on a single wafer. The wafer is then cut to separate the individual dice. Each of these semiconductor dice should then be individually mounted onto a support surface for further processing by utilizing a die bonding process. Simultaneously or thereafter, electrical connections are created between the dice and external devices, and the dice are later encapsulated with a plastic compound to protect them from the environment.

In prior art die bonders, the die bonding process includes the step of picking up an individual die from the wafer with a bond arm. The die is then transported to a bonding site for bonding onto a substrate which has an adhesive dispensed thereon to attach the die onto the substrate. A single head dispensing system is usually deployed to dispense an adhesive material onto the substrate. In order to increase throughput of the operation dispensing systems with dual heads may be used.

However, the speed with which adhesive can be applied is constrained, which limits throughput. It would be beneficial to provide a faster dispensing apparatus as compared to the prior art.

SUMMARY OF THE INVENTION

It is thus an object of this invention to seek to provide an adhesive dispenser which overcomes at least some of the aforementioned problems of the prior art.

According to a first aspect of the present invention, there is provided an adhesive dispenser for a die bonding apparatus, comprising: an adhesive dispenser head configured to dispense adhesive onto bonding pads of a substrate; and a head conveyer configured to convey the adhesive dispenser head along orthogonal first and second axes for dispensing the adhesive onto target dispensing positions on the bonding pads, the head conveyor comprising a first linear positioning motor operative to convey the adhesive dispenser head along the first axis and a rotary positioning motor coupled to the first linear positioning motor which is operative to rotate the adhesive dispenser head, the rotary positioning motor being configured to cooperate with the first linear positioning motor to convey the adhesive dispenser head along the second axis to the target dispensing positions.

The first aspect recognizes that a problem with existing die bonding arrangements is that the die bonders tend to move the adhesive dispenser head in the horizontal XY plane to dispensing positions by means of two orthogonally arranged drives. A disadvantage of this arrangement is that when moving the dispenser head to a new dispensing position, relatively large masses need to be accelerated. Moving those relatively large masses requires powerful drive systems and robust bearings. This sets limits on the maximum possible acceleration values and therefore the production rate of the die bonder. Accordingly, an adhesive dispenser is provided. The adhesive dispenser may be for a die bonding apparatus. The adhesive dispenser may be configured or arranged to dispense adhesive onto bonding pads of a substrate located at target dispensing locations. The adhesive dispenser may comprise a head conveyer. The head conveyer may be configured or adapted to convey, move or displace the adhesive dispenser head along first and second axes to dispense the adhesive at target dispensing positions onto the bonding pads. The first and second axes may be orthogonal with respect to each other. The head conveyer may comprise a first motor. The first motor may convey, move or displace the adhesive dispenser along the first axis. The head conveyor may comprise a rotary or pivoting position motor. The rotary position motor may rotate or pivot the adhesive dispenser head. The rotary positioning motor and the first motor may operate together to convey, move or displace the dispenser head along the second axis to the target dispensing positions. In this way, the first positioning motor and the rotary positioning motor may together move the adhesive dispenser head in the first and second axes, which avoids the need for orthogonally arranged drives and reduces the mass of the components of the head conveyer which move the adhesive dispenser head to the target dispensing positions. This enables relatively smaller masses to be accelerated, which reduces the power required from the drive systems and reduces the load requirement of the bearings. This increases the maximum possible acceleration rate and therefore the production rate of the die bonder.

In one embodiment, the rotary positioning motor is configured to rotate the adhesive dispenser head about a third axis which is orthogonal to the first and second axes.

In one embodiment, the first linear positioning motor is configured to cooperate with the rotary positioning motor to apply a correction displacement along the first axis upon rotation of the adhesive dispenser head to convey the adhesive dispenser head to the target dispensing positions.

In one embodiment, the first linear positioning motor is configured to cooperate with the rotary positioning motor to apply a first correction displacement along the first axis upon a first rotation of the adhesive dispenser head to convey the adhesive dispenser head to a first target dispensing position and to apply a second correction displacement along the first axis upon a second rotation of the adhesive dispenser head to convey the adhesive dispenser head to a second target dispensing position.

In one embodiment, the head conveyor is configured to convey the adhesive dispenser head along the third axis.

In one embodiment, the head conveyer comprises a dispenser head mount rotatable about the third axis by the rotary positioning motor and the adhesive dispenser head is received by the dispenser head mount.

In one embodiment, the dispenser head mount, the adhesive dispenser head and the dispenser head mount rotator motor are configured to align their centre of gravity about the third axis.

In one embodiment, the adhesive dispenser head has an elongate axis and the dispenser head mount is configured to receive the adhesive dispenser head to position the elongate axis non-orthogonally with respect to the first, second and third axes.

In one embodiment, the head conveyor comprises a first axis slide mount displaceable along the first axis by the first linear positioning motor and the dispenser head mount is received by the first axis slide mount.

In one embodiment, the dispenser head mount depends from the first axis slide mount and is displaceable along the first axis by the first linear positioning motor.

In one embodiment, the head conveyor comprises a third axis slide mount displaceable along the third axis by a third linear positioning motor and the first axis slide mount is received by the third axis slide mount.

In one embodiment, the first axis slide mount depends from the third axis slide mount and is displaceable along the third axis by the third linear positioning motor.

In one embodiment, the third axis slide mount is recessed to prevent contact with the adhesive dispenser head.

In one embodiment, the head conveyor comprises a second axis slide mount displaceable along the second axis by a second linear positioning motor and the third axis slide mount is received by the second axis slide mount.

In one embodiment, the third axis slide mount depends from the second axis slide mount and is displaceable along the second axis by the second linear positioning motor.

In one embodiment, the second axis slide mount comprises a first mount part and a second mount part, the first mount part is located in a fixed position with respect to the substrate and the second mount part is displaceable along the second axis with respect to the substrate.

In one embodiment, the third axis slide mount is received by the second mount part of the second axis slide mount.

In one embodiment, the bonding pads are arranged in rows and columns and the head conveyor is configured to convey the adhesive dispenser head to a first target dispensing position on a first row of a first column and to rotate the adhesive dispenser head to at least a second target dispensing position on a second row of the first column.

In one embodiment, the head conveyor is configured to rotate the adhesive dispenser head to at least a third target dispensing position on a third row of the first column.

In one embodiment, the second and third rows are positioned on opposing sides of the first row.

In one embodiment, the head conveyor is configured to rotate the adhesive dispenser head from the first target dispensing position with a first angle of rotation to the second target dispensing position and to rotate the adhesive dispenser head from the first target dispensing position with a second angle of rotation to the second target dispensing position, wherein the second angle of rotation is equal in magnitude but opposite in sign to the first angle of rotation.

According to a second aspect, there is provided a method, comprising: providing an adhesive dispenser head configured to dispense adhesive onto bonding pads of a substrate; providing a head conveyer comprising a first linear positioning motor and a rotary positioning motor configured to convey the adhesive dispenser head along orthogonal first and second axes for dispensing the adhesive onto target dispensing positions on the bonding pads; and activating the first linear positioning motor and the rotary positioning motor to convey the adhesive dispenser head along the second axis to the target dispensing positions.

In one embodiment, the method comprises rotating the adhesive dispenser head about a third axis which is orthogonal to the first and second axes with the rotary positioning motor.

In one embodiment, the method comprises applying a correction displacement along the first axis with the first linear positioning motor upon rotation of the adhesive dispenser head by the rotary positioning motor to convey the adhesive dispenser head to the target dispensing positions.

In one embodiment, the method comprises applying a first correction displacement along the first axis upon a first rotation of the adhesive dispenser head to convey the adhesive dispenser head to a first target dispensing position and applying a second correction displacement along the first axis upon a second rotation of the adhesive dispenser head to convey the adhesive dispenser head to a second target dispensing position.

In one embodiment, the method comprises conveying the adhesive dispenser head along the third axis with the head conveyor.

In one embodiment, the head conveyer comprises a dispenser head mount and the method comprises rotating the dispenser head mount about the third axis using the rotary positioning motor.

In one embodiment, the method comprises receiving the adhesive dispenser head with the dispenser head mount.

In one embodiment, the method comprises configuring the dispenser head mount, the adhesive dispenser head and the dispenser head mount rotator motor to align their centre of gravity about the third axis.

In one embodiment, the adhesive dispenser head has an elongate axis and the method comprises receiving the adhesive dispenser head with the dispenser head mount to position the elongate axis non-orthogonally with respect to the first, second and third axes.

In one embodiment, the head conveyer comprises a first axis slide mount displaceable along the first axis by the first linear positioning motor.

In one embodiment, the method comprises receiving the dispenser head mount with the first axis slide mount.

In one embodiment, the dispenser head mount depends from the first axis slide mount.

In one embodiment, the method comprises displacing the dispenser head mount along the first axis with the first linear positioning motor.

In one embodiment, the head conveyor comprises a third axis slide mount displaceable along the third axis by a third linear positioning motor.

In one embodiment, the method comprises receiving the first axis slide mount with the third axis slide mount.

In one embodiment, the first axis slide mount depends from the third axis slide mount.

In one embodiment, the method comprises displacing the first axis slide mount along the third axis with the third linear positioning motor.

In one embodiment, the third axis slide mount is recessed to prevent contact with the adhesive dispenser head.

In one embodiment, the head conveyor comprises a second axis slide mount.

In one embodiment, the method comprises displacing the second axis slide mount along the second axis with a second linear positioning motor.

In one embodiment, the method comprises receiving the third axis slide mount with the second axis slide mount.

In one embodiment, the third axis slide mount depends from the second axis slide mount and is displaceable along the second axis by the second linear positioning motor.

In one embodiment, the second axis slide mount comprises a first mount part and a second mount part, the first mount part is located in a fixed position with respect to the substrate and the second mount part is displaceable along the second axis with respect to the substrate.

In one embodiment, the third axis slide mount is received by the second mount part of the second axis slide mount.

In one embodiment, the bonding pads are arranged in rows and columns and the method comprises conveying the adhesive dispenser head to a first target dispensing position on a first row of a first column and rotating the adhesive dispenser head to at least a second target dispensing position on a second row of the first column.

In one embodiment, the method comprises rotating the adhesive dispenser head to at least a third target dispensing position on a third row of the first column.

In one embodiment, the second and third rows are positioned on opposing sides of the first row.

In one embodiment, the method comprises rotating the adhesive dispenser head from the first target dispensing position with a first angle of rotation to the second target dispensing position and rotating the adhesive dispenser head from the first target dispensing position with a second angle of rotation to the second target dispensing position, wherein the second angle of rotation is equal in magnitude but opposite in sign to the first angle of rotation.

These and other features, aspects, and advantages will become better understood with regard to the description section, appended claims, and accompanying drawings.

BRIEF DESCRIPTION OF THE DRAWINGS

Embodiments of the present invention will now be described, by way of example only, with reference to the accompanying drawings, in which.

In the drawings, like parts are denoted by like reference numerals.

DETAILED DESCRIPTION

Before discussing embodiments in any more detail, first an overview will be provided. Embodiments provide a dispenser head for a die bonder. The dispenser head deposits adhesive at target dispensing locations for die bonding. The dispenser head is operable to move along one axis and can rotate about another axis so that adhesive can be applied at the target bonding locations on a substrate. The combined operation of the linear movement together with the rotation enables multiple dispensing positions to be accessed along different axes without the need to activate orthogonal drives. This provides for a compact arrangement, which can be counterbalanced, with drives mounted as close as possible along the centre of gravity so that the moment load on the bearings remains low, which provides for high acceleration of the dispenser head and faster settling times. In some embodiments, further drives are provided to drive the dispenser head along other axes in order to improve the operation of the adhesive dispenser. The mechanical arrangement of the adhesive dispenser is such that one drive depends, extends or is nested on the other. This means that the different drives can be of differing sizes since they would only move reduced masses. By arranging for the portions of the head conveyer which are driven the least to receive portions of the head conveyer which are driven the most, the portions which are driven the most can be smaller and hence driven by smaller motors. This means that the mass which is driven more is lower than the mass that is driven less, which improves the operation of the adhesive dispenser.

Adhesive Dispenser

Figure 1:
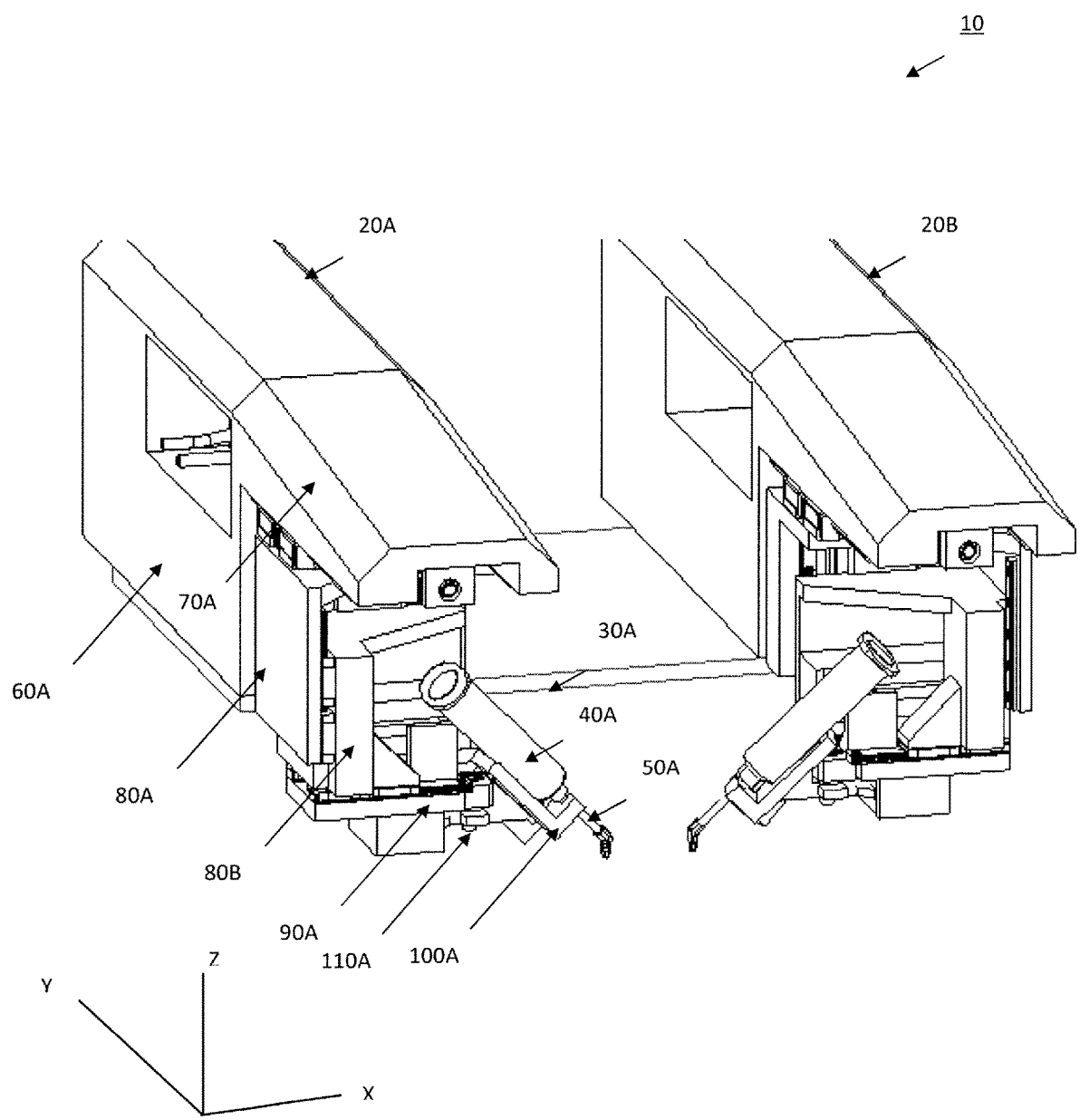
FIG. 1 is a perspective view of an adhesive dispenser according to one embodiment.

FIG. 1 is a perspective view of an adhesive dispenser 10 for a die bonding apparatus. In this embodiment, a pair of opposing and mirrored head conveyers 20A, 20B are arranged to dispense adhesive onto bonding pads of a substrate (not shown). The substrate is typically located on a vacuum chuck (not shown) extending on a horizontal plane along X and Y axes. For brevity, just one of the head conveyers 20A will be described in more detail, however, as can be seen, the head conveyer 20B provides a mirror arrangement. The head conveyer 20A conveys an adhesive dispenser head 30A to target dispensing positions over the substrate and a syringe mechanism 40A ejects the required amount of adhesive from a nozzle 50A.

The head conveyor 20A comprises a main housing 60A. The housing 60A is fixed in relation to the vacuum chuck and has a Y axis movement mechanism 70A. Suspended from the Y axis movement mechanism 70A is a Z axis movement mechanism 80A. Suspended from the Z axis movement mechanism 80A is a Z axis movable bracket 80B. Suspended from the Z axis movable bracket 80B is an X axis movable bracket 90A. Coupled to the X axis movable bracket 90A is a syringe mount 100A. The syringe mount 100A is coupled via a Z axis pivot 110A. The syringe mount 100A is angled obliquely to the X, Y and Z axes; in this example, at around 45 degrees. The syringe mount 100A carries the adhesive dispenser head 30A.

Figure 2:
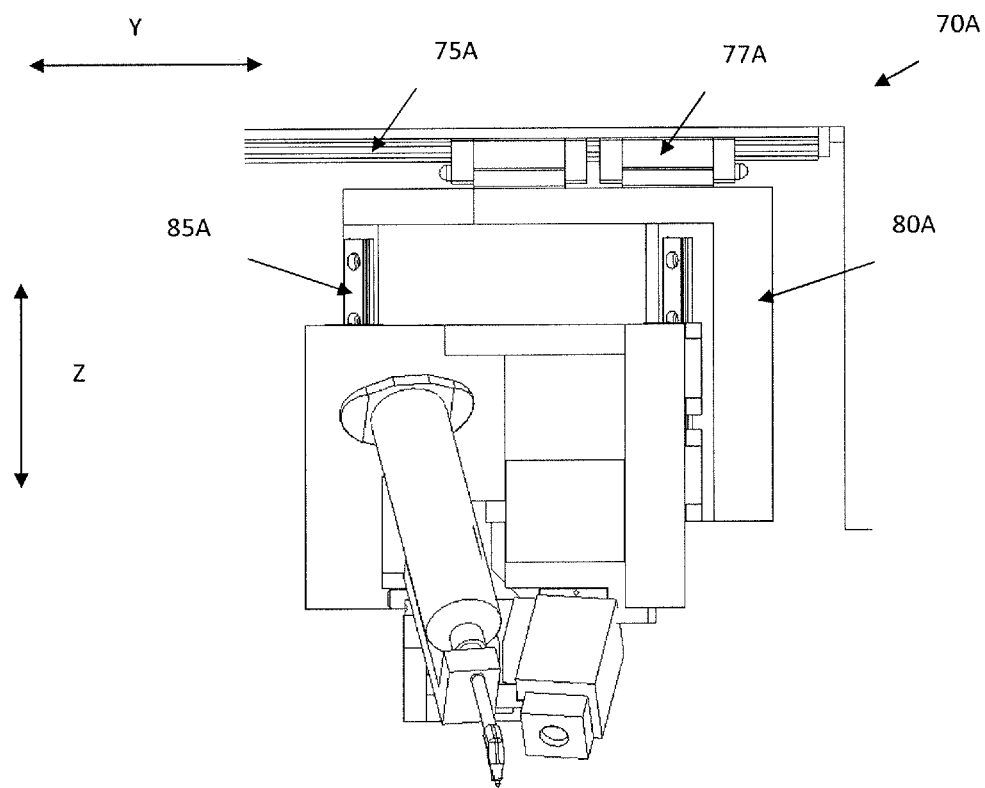
FIG. 2 is a partial side view of a head conveyer of FIG. 1.

As can be seen in more detail in FIG. 2, the Y axis movement mechanism 70A carries rails 75A which engage with a Y axis linear guide block 77A that is drivable along the rails 75A to facilitate movement in the Y axis. Likewise, the Z axis movement mechanism 80A has rails 85A which engage with Z axis linear motors (not shown) to facilitate movement along the Z axis.

Figure 3:
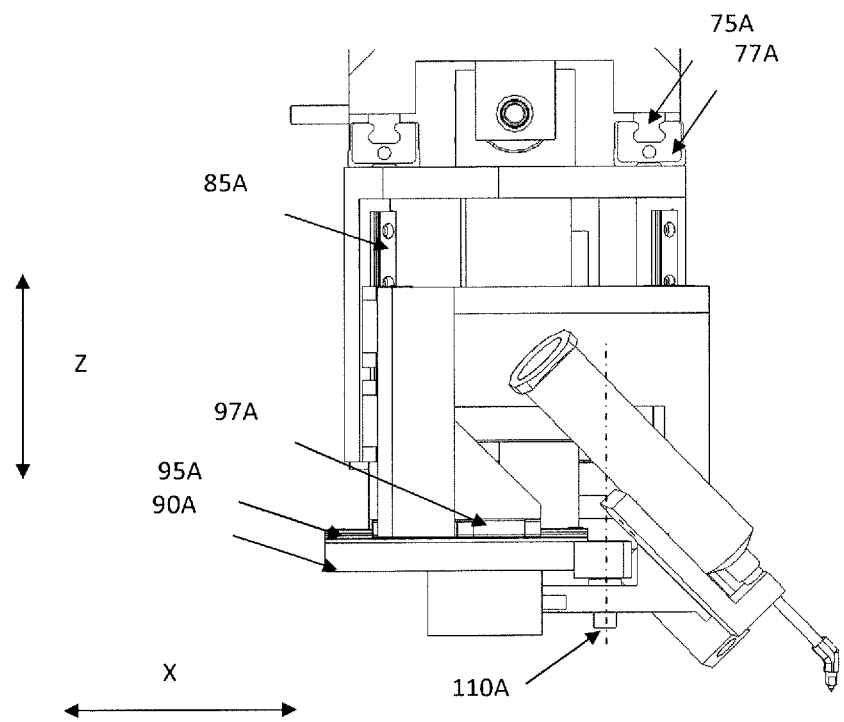
FIG. 3 is another partial side view of the head conveyer of FIG. 1.

As can be seen in more detail in FIG. 3, the X axis movable bracket 90A has rails 95A which engage with an X axis linear guide block 97A that is drivable along the rails 95A to facilitate movement along the X axis. The syringe mount 100A, which pivots about the Z axis by way of the Z axis pivot 110A, is driven by an arc motor 120A whose coil 135A is attached to the syringe mount 100A.

Figure 4:
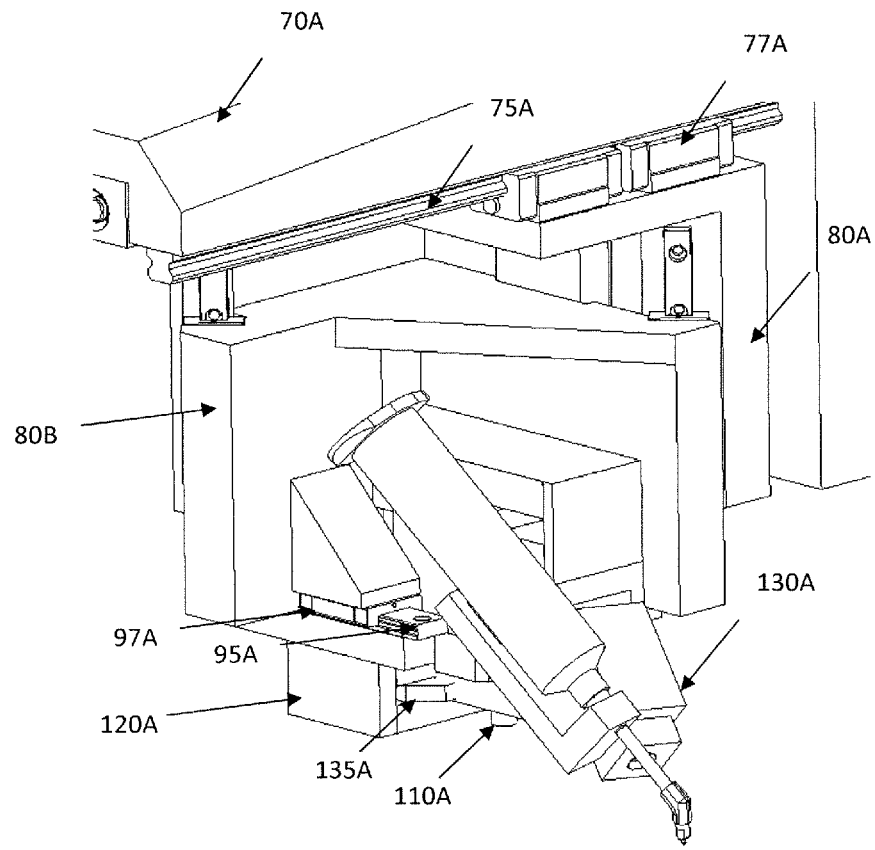
FIG. 4 is a partial perspective view of the head conveyer of FIG. 1.

As can be seen in more detail in FIG. 4, a camera 130A provides visual feedback to a controller (not shown) which controls the operation of the head conveyer 20A.

Figure 5:
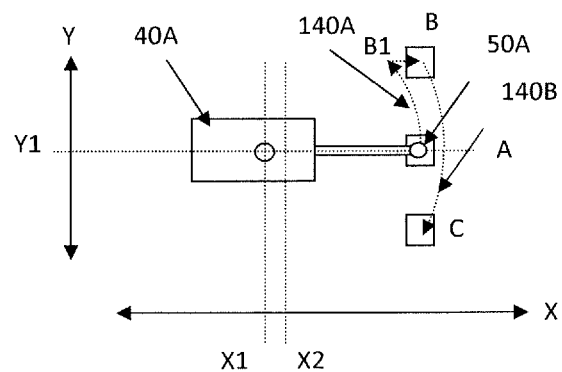
FIG. 5 illustrates an exemplary operation of the head conveyer of FIG. 1.

The operation of the adhesive dispenser will now be described in more detail with reference to FIG. 5. Operation commences with the syringe nozzles 50A in a raised and retracted position, while the substrate is placed on to the vacuum chuck. The Y axis linear motors 77A are activated to displace the Z axis rail mechanism 80A and all the other components that are arranged thereon to position Y1 along the Y axis. The X axis linear motor 97A is activated to move the X axis movable bracket 90A to position X1 along the X axis. The nozzle 50A is now aligned with target dispensing position A. The Z axis linear motor is activated which displaces the Z axis movable bracket 80B to the correct height over the target dispensing position A, which is confirmed by visual feedback provided by the camera 130A. An appropriate amount of adhesive is dispensed. The Z axis linear motor is activated which raises the Z axis movable bracket 80B and elevates the nozzle 50A clear of the substrate.

The arc motor 120A is activated which causes the nozzle 50A to move along the arc 140A to position B1. The X axis linear motor 97A is activated to move the X axis movable bracket 100A to position X2. The syringe nozzle 50A is now at target dispensing position B. The Z axis motor is activated to lower the nozzle 50A, which is confirmed by visual feedback provided by the camera 130A. Adhesive is dispensed before the nozzle 50A is again raised, as described above.

The arc motor 120A is activated to rotate the syringe mount 100A to move the nozzle 50A along the arc 140B to target dispensing position C, which is confirmed by visual feedback provided by the camera 130A, where adhesive can be dispensed, as described above.

This process can then be repeated to access further target dispensing positions.

In this way, it can be seen that multiple target dispensing positions can be accessed without needing to activate the Y axis rail mechanism to reach each of those target dispensing positions. Instead, a simple activation of the arc motor 120A, together with a small activation of the X axis motor 97A (when necessary, to provide a correction along the X axis) is all that is required. This makes the dispensing of adhesive much faster, since only a small mass (typically just the syringe mount and syringe) is all that needs to be moved, which decreases the size of the corresponding motors and bearings, increases acceleration speeds and reduces inertia, which reduces settling times compared to activations of the Y axis rail mechanism (which moves significantly more components).

In one embodiment, a die bonder contains a dispenser head which comprises a z axis movable bracket, a syringe mount rotatable on a vertical axis and a radial mount carries the syringe mount. The radial mount is movable back and forth in horizontal direction and moves the syringe mount with it. The z movable bracket carries both the radial mount and syringe mount.

In one embodiment, a dispenser head comprises a rotatable syringe mount, radial mount and Z movable bracket. The syringe mount is rotatable on a vertical axis on the radial mount. The radial mount carries the syringe mount and is movable back and forth in horizontal direction (along the x-axis). The Z movable bracket carries both the radial mount and syringe mount and is movable up and down in the vertical direction (along the z-axis). The syringe mount is rotatable by an angle of approximately +/−15 deg in relation to the x-direction. An arc motor serves as the drive for the syringe mount, the coil is arranged opposite the syringe mount in relation to the vertical axis so that the syringe mount is counterbalanced and arranged so that the centre of gravity of the whole moving mass lies as close as possible to the vertical axis. On rotation of the syringe mount the load on the bearing therefore remains low. The drives for both the radial mount and Z axis movable bracket lie as close as possible along the centre of gravity so that the moment load on the bearing therefore remains low.

Preferred embodiments of the invention provide a design which has a more compact construction than existing arrangements. The radial movement of the syringe mount in the horizontal plane can take place with very high acceleration as the mass to be accelerated is comparatively low, appreciably higher accelerations of the dispenser head are possible in the horizontal plane than with existing arrangements. The rotating movement of the syringe mount around the vertical axis can take place with very high acceleration as the mass to be accelerated is comparatively low, appreciably higher accelerations of the dispenser head are possible in the horizontal plane than with existing arrangements. The reduced load on the bearing leads to reduced oscillating tendency of the dispenser head with faster settling. The dispensing process is therefore faster.

Although the present invention has been described in considerable detail with reference to certain embodiments, other embodiments are possible.

Therefore, the spirit and scope of the appended claims should not be limited to the description of the embodiments contained herein.

The invention claimed is:

1. An adhesive dispenser for a die bonding apparatus, comprising:
an adhesive dispenser head configured to dispense adhesive onto bonding pads of a substrate; and
a head conveyor configured to convey the adhesive dispenser head along orthogonal first and second axes for dispensing the adhesive onto target dispensing positions on the bonding pads, the head conveyor comprising a first linear positioning motor operative to convey the adhesive dispenser head along the first axis and a rotary positioning motor coupled to the first linear positioning motor which is operative to rotate the adhesive dispenser head, the rotary positioning motor being configured to cooperate solely with the first linear positioning motor to convey the adhesive dispenser head along the second axis to multiple target dispensing positions;
wherein the rotary positioning motor is configured to rotate the adhesive dispenser head about a third axis which is orthogonal to the first and second axes.

2. The adhesive dispenser of claim 1, wherein the first linear positioning motor is configured to cooperate with the rotary positioning motor to apply a correction displacement along the first axis upon rotation of the adhesive dispenser head to convey the adhesive dispenser head to the target dispensing positions.

3. The adhesive dispenser of claim 1, wherein the first linear positioning motor is configured to cooperate with the rotary positioning motor to apply a first correction displacement along the first axis upon a first rotation of the adhesive dispenser head to convey the adhesive dispenser head to a first target dispensing position and to apply a second correction displacement along the first axis upon a second rotation of the adhesive dispenser head to convey the adhesive dispenser head to a second target dispensing position.

4. The adhesive dispenser of claim 1, wherein the head conveyor is configured to convey the adhesive dispenser head along the third axis.

5. The adhesive dispenser of claim 1, wherein the head conveyor comprises a dispenser head mount rotatable about the third axis by the rotary positioning motor and the adhesive dispenser head is received by the dispenser head mount.

6. The adhesive dispenser of claim 1, wherein a dispenser head mount, the adhesive dispenser head and the rotary positioning motor are configured to align their centre of gravity about the third axis.

7. The adhesive dispenser of claim 6, wherein the adhesive dispenser head has an elongate axis and the dispenser head mount is configured to receive the adhesive dispenser head to position the elongate axis non-orthogonally with respect to the first, second and third axes.

8. The adhesive dispenser of claim 6, wherein the head conveyor comprises a first axis slide mount displaceable along the first axis by the first linear positioning motor and the dispenser head mount is received by the first axis slide mount.

9. The adhesive dispenser of claim 8, wherein the dispenser head mount depends from the first axis slide mount and is displaceable along the first axis by the first linear positioning motor.

10. The adhesive dispenser of claim 8, wherein the head conveyor comprises a third axis slide mount displaceable along the third axis by a third axis linear positioning motor and the first axis slide mount is received by the third axis slide mount.

11. The adhesive dispenser of claim 10, wherein the first axis slide mount depends from the third axis slide mount and is displaceable along the third axis by the third axis linear positioning motor.

12. The adhesive dispenser of claim 10, wherein the third axis slide mount is recessed to prevent contact with the adhesive dispenser head.

13. The adhesive dispenser of claim 10, wherein the head conveyor comprises a second axis slide mount displaceable along the second axis by a second axis linear positioning motor and the third axis slide mount received by the second axis slide mount.

14. The adhesive dispenser of claim 13, wherein the third axis slide mount depends from the second axis slide mount and is displaceable along the second axis by the second axis linear positioning motor.

15. The adhesive dispenser of claim 13, wherein the second axis slide mount comprises a first mount part and a second mount part, the first mount part is located in a fixed position with respect to the substrate and the second mount part is displaceable along the second axis with respect to the substrate.

16. The adhesive dispenser of claim 15, wherein the third axis slide mount is received by the second mount part of the second axis slide mount.

* * * * *